United States Patent
Khlat et al.

(10) Patent No.: US 8,068,573 B1
(45) Date of Patent: Nov. 29, 2011

(54) PHASE DITHERED DIGITAL COMMUNICATIONS SYSTEM

(75) Inventors: Nadim Khlat, Midi-Pyrenees (FR); Richard A. Summe, Greensboro, NC (US); Scott Robert Humphreys, Greensboro, NC (US); Chris Ngo, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 1250 days.

(21) Appl. No.: 11/740,967

(22) Filed: Apr. 27, 2007

(51) Int. Cl.
*H04L 7/00* (2006.01)
*H03L 7/00* (2006.01)

(52) U.S. Cl. .................. 375/355; 327/141; 375/354
(58) Field of Classification Search .................. 375/355
See application file for complete search history.

(56) References Cited

U.S. PATENT DOCUMENTS

| | | | |
|---|---|---|---|
| 4,545,072 A | 10/1985 | Skutta et al. | |
| 4,896,318 A | 1/1990 | Kokubo et al. | |
| 5,019,786 A * | 5/1991 | Fairley et al. | 324/76.77 |
| 5,226,058 A | 7/1993 | Anderson et al. | |
| 5,263,055 A | 11/1993 | Cahill | |
| 5,335,363 A | 8/1994 | Basciano | |
| 5,745,848 A | 4/1998 | Robin | |
| 5,781,849 A | 7/1998 | Carlsson et al. | |
| 5,812,590 A | 9/1998 | Black et al. | |
| 5,926,514 A | 7/1999 | Meador et al. | |
| 6,345,175 B1 | 2/2002 | Murakami | |
| 6,567,654 B1 | 5/2003 | Coronel Arredondo et al. | |
| 6,898,420 B2 * | 5/2005 | Black et al. | 455/296 |
| 2002/0193140 A1 * | 12/2002 | Behrens et al. | 455/553 |
| 2003/0107432 A1 * | 6/2003 | Huynh | 330/9 |
| 2005/0219628 A1 * | 10/2005 | Yasutomi et al. | 358/3.16 |
| 2006/0017486 A1 * | 1/2006 | Iler | 327/291 |
| 2006/0214714 A1 * | 9/2006 | Kim et al. | 327/175 |
| 2007/0127608 A1 * | 6/2007 | Scheim et al. | 375/346 |
| 2007/0216457 A1 * | 9/2007 | Agarwal et al. | 327/175 |
| 2008/0057967 A1 * | 3/2008 | Goldsmith | 455/447 |
| 2008/0146281 A1 * | 6/2008 | Cohen et al. | 455/558 |
| 2009/0304112 A1 * | 12/2009 | Lomas et al. | 375/329 |
| 2010/0127789 A1 * | 5/2010 | Kenly et al. | 332/109 |

FOREIGN PATENT DOCUMENTS
WO   WO 2007118062 A2 * 10/2007
* cited by examiner

*Primary Examiner* — David C. Payne
*Assistant Examiner* — Erin File
(74) *Attorney, Agent, or Firm* — Withrow & Terranova, P.L.L.C.

(57) ABSTRACT

The present invention is a phase dithered digital communications system that includes a digital receiver, and uses phase dithering to spread the energy of one or more system clocks to minimize receiver de-sensitization. Phase dithering uses a single frequency for each system clock; however, the energy of each system clock is spread over a range of frequencies by changing the duty-cycle of each clock half-cycle. A non-phase dithered clock drives the sampling clock of a receiver analog-to-digital converter to provide accurate correlation with received information, which may allow use of a higher frequency sampling clock than in frequency dithered designs. Phase dithered clocks and non-phase dithered clocks may have constant frequencies that are related to each other by a ratio of two integers; therefore, the time base used for extracting received data is always correlated and accurate.

26 Claims, 7 Drawing Sheets

PHASE DITHERED DIGITAL COMMUNICATIONS SYSTEM

FIELD OF THE INVENTION

The present invention relates to digital receivers used in digital communications systems that are part of radio frequency (RF) communications systems.

BACKGROUND OF THE INVENTION

RF communications systems typically use digital circuitry to provide control and data management functions, to process received and transmitted digital signals, to provide user and communication interfaces, to provide other digital functions, or any combination thereof. Such a system is typically supplied with at least one system clock that provides overall timing for the system. Digital circuitry within the system tends to transition synchronously with the system clock, which may generate voltage spikes, current spikes, or both. The voltage and current spikes may generate interfering noise signals at the fundamental frequency and harmonics of the system clock. If a frequency of an interfering noise signal falls within the passband of a received RF signal, receiver sensitivity can be degraded, which is known as receiver de-sensitization.

Dithering the frequency of the system clock, called frequency dithering, is one method for spreading the energy of interfering noise signals over a range of frequencies to minimize the energy of noise signals that fall within the passband of the received signal. Frequency dithering involves shifting, or dithering, the frequency of the system clock from a nominal frequency during reception of a certain amount of received information. Such a system is described in U.S. Pat. No. 6,898,420. The received information must be correlated, synchronized, or both with the shifted system clock frequency. Such a system may work well when receiving separated blocks of information; however, in continuous receiver types of systems, such as wideband code division multiple access (WBCDMA) systems, relating received information to the system clock may be problematic. Thus, there is a need for a continuous receiver communications system that spreads the energy of a system clock to minimize receiver de-sensitization.

SUMMARY OF THE INVENTION

The present invention is a phase dithered digital communications system that includes a digital receiver, and uses phase dithering to spread the energy of one or more system clocks to minimize receiver de-sensitization. Phase dithering uses a single frequency for each system clock; however, the energy of each system clock is spread over a range of frequencies by changing the duty-cycle of each clock half-cycle. A non-phase dithered clock drives the sampling clock of a receiver's analog-to-digital converter to provide accurate correlation with received information. Using a non-phase dithered clock may allow use of a higher frequency sampling clock than in frequency dithered designs. Phase dithered clocks and non-phase dithered clocks may have constant frequencies that are related to each other by a ratio of two integers; therefore, the time base used for extracting received data is always correlated and accurate. The maximum error due to dithering is the phase dithering of one clock half-cycle. There is no cumulative error over time as with some frequency dithering systems.

The phase dithered digital receiver may be part of a continuous receiver system, such as a WBCDMA system. Additionally, the phase dithered digital receiver may be part of a non-continuous receiver system, such as an enhanced general packet radio service (EGPRS) system. In systems with multiple system clocks, at least one of the system clocks may be phase dithered, and at least one of the system clocks may be non-dithered. Each system clock may clock all or part of the digital circuitry in the system.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a phase dithered digital communications system that includes a digital receiver, and uses phase dithering to spread the energy of one or more system clocks to minimize receiver de-sensitization. Phase dithering uses a single frequency for each system clock; however, the energy of each system clock is spread over a range of frequencies by changing the duty-cycle of each clock half-cycle. A non-phase dithered clock drives the sampling clock of a receiver analog-to-digital converter to provide accurate correlation with received information, which may allow use of a higher frequency sampling clock than in frequency dithered designs. Phase dithered clocks and non-phase dithered clocks may have constant frequencies that are related to each other by a ratio of two integers; therefore, the time base used for extracting received data is always correlated and accurate. The maximum error due to dithering is the phase dithering of one clock half-cycle. There is no cumulative error over time as with some frequency dithering systems. In one embodiment of the present invention, the pattern of phase dithering may be selected as a function of the center frequency of a selected receiver channel to optimize the energy spreading of the phase dithered system clocks.

The phase dithered digital receiver may be part of a continuous receiver system, such as a WBCDMA system. Additionally, the phase dithered digital receiver may be part of a non-continuous receiver system, such as an enhanced general packet radio service (EGPRS) system. In systems with multiple system clocks, at least one of the system clocks may be phase dithered, and at least one of the system clocks may be non-dithered. Each system clock may clock all or part of the digital circuitry in the system.

Figure 1:
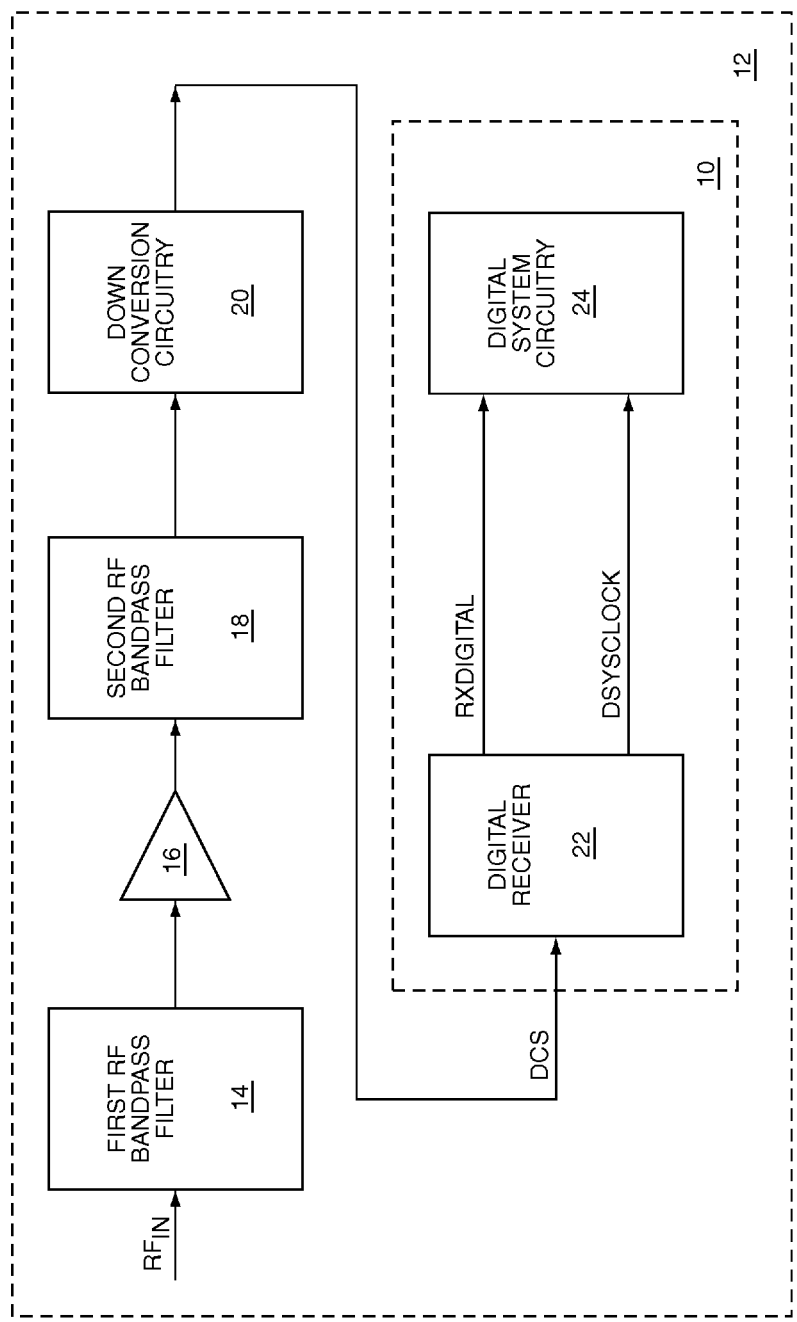
FIG. 1 shows a phase dithered digital communications system used in an RF communications system.

FIG. 1 shows one embodiment of a phase dithered digital communications system 10 used in an RF communications system 12. An RF input signal $RF_{IN}$ is received by a first RF bandpass filter 14, which filters out unwanted signals from the RF input signal $RF_{IN}$ and feeds a low noise amplifier (LNA) 16. The LNA 16 amplifies the filtered RF signal and feeds a second RF bandpass filter 18, which provides additional filtering and feeds down conversion circuitry 20. The down conversion circuitry 20 down converts the amplified filtered RF signal into a down converted signal DCS, which is then fed into a digital receiver 22 that is part of the phase dithered digital communications system 10. The digital receiver 22 converts the down converted signal DCS from analog form into received digital data RXDIGITAL, which is then fed into digital system circuitry 24. Additionally, the digital receiver 22 provides a phase dithered system clock DSYSCLOCK to the digital system circuitry 24. The phase dithered system clock DSYSCLOCK may be used to clock all or part of the digital system circuitry 24 such that all or part of the digital system circuitry 24 may change state based on the phase dithered system clock DSYSCLOCK.

Figure 2:
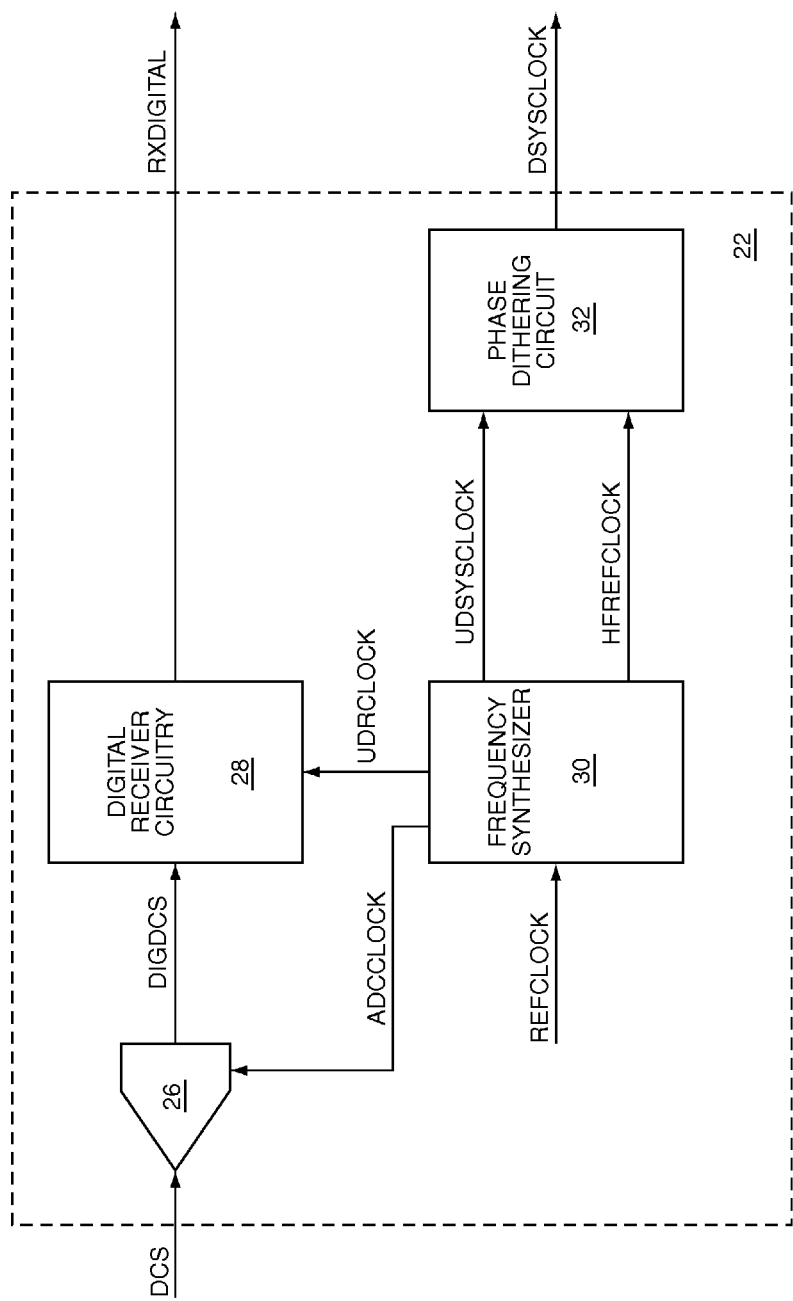
FIG. 2 shows details of the digital receiver of FIG. 1.

FIG. 2 shows one embodiment of the digital receiver 22 of FIG. 1. The down converted signal DCS is fed into an analog-to-digital (A-to-D) converter 26, which converts the down converted signal DCS from analog form into a digital down converted signal DIGDCS. Digital receiver circuitry 28 may filter and de-modulate the digital down converted signal DIGDCS, and then extract and provide the received digital data RXDIGITAL. A frequency synthesizer 30 uses a reference clock REFCLOCK to synthesize clocks that are needed by the phase dithered digital communications system 10. The frequency of each needed clock is a multiple of the frequency of the reference clock REFCLOCK times a ratio of two integers; therefore, the ratio of any two clocks provided by the frequency synthesizer is a ratio of two integers. This integer ratio allows two different circuits, each of which is clocked by one of the two clocks, to correlate data between the two circuits. The frequency synthesizer 30 provides an A-to-D clock ADCCLOCK to the A-to-D converter 26 to clock sampling of the down converted signal DCS. The A-to-D clock ADCCLOCK is non-dithered to preserve accurate sampling of the down converted signal DCS. The frequency synthesizer 30 provides a non-dithered system clock UDSYSCLOCK to a phase dithering circuit 32, which adds phase dithering to provide the phase dithered system clock DSYSCLOCK. In this embodiment of the present invention, the frequency synthesizer 30 provides a non-dithered receiver clock UDRCLOCK to the digital receiver circuitry 28 to simplify correlation of data with the A-to-D converter 26. Additionally, the frequency synthesizer 30 provides a high frequency reference clock HFREFCLOCK to the phase dithering circuit 32 to provide clocking for phase dithered clock signals.

Figure 3:
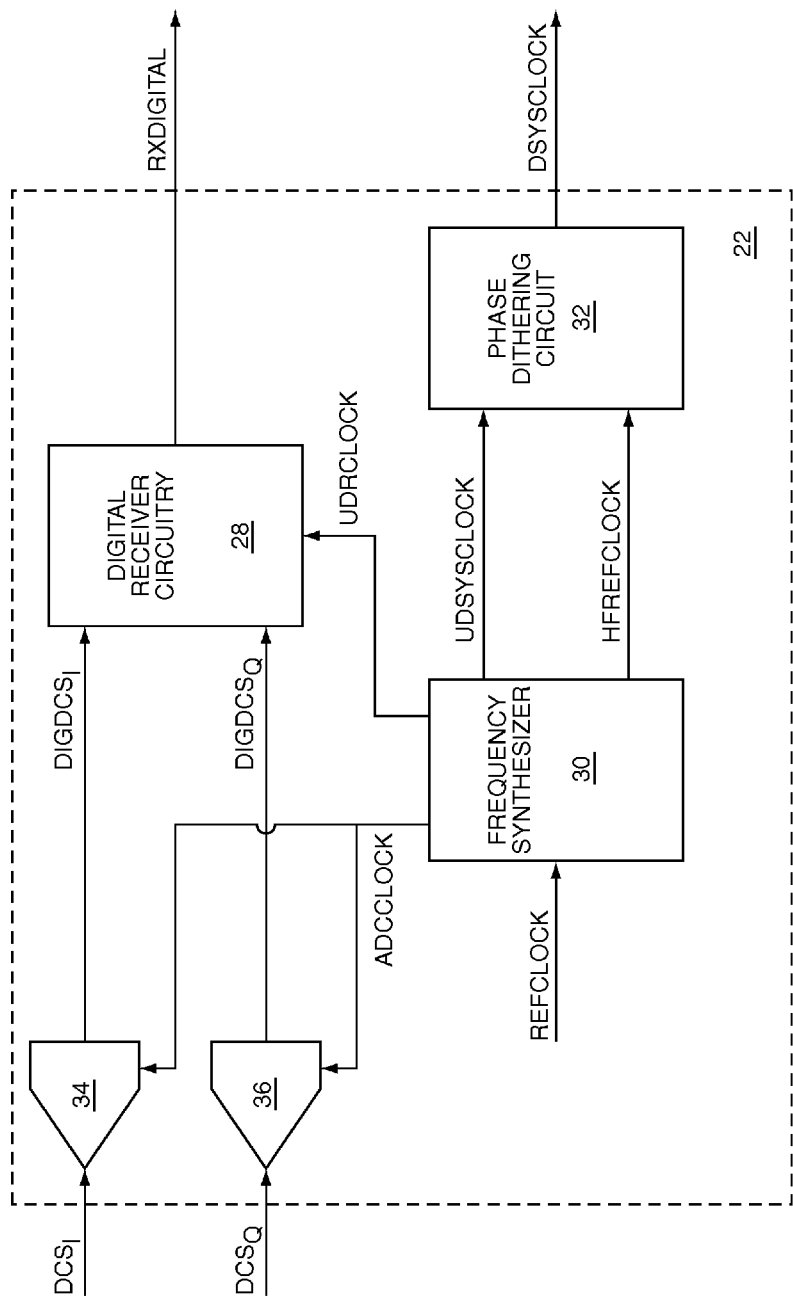
FIG. 3 shows a version of the digital receiver of FIG. 2 that receives quadrature down converted signals.

FIG. 3 shows a version of the digital receiver 22 of FIG. 2 that receives quadrature down converted signals. An in-phase down converted signal $DCS_I$ is fed into an in-phase A-to-D converter 34, which converts the in-phase down converted signal $DCS_I$ from analog form into an in-phase digital down converted signal $DIGDCS_I$. The digital receiver circuitry 28 may filter and de-modulate the in-phase digital down converted signal $DIGDCS_I$. A quadrature-phase down converted signal $DCS_Q$ is fed into a quadrature-phase A-to-D converter 36, which converts the quadrature-phase down converted signal $DCS_Q$ from analog form into a quadrature-phase digital down converted signal $DIGDCS_Q$. The digital receiver circuitry 28 may filter and de-modulate the quadrature-phase digital down converted signal $DIGDCS_Q$. The digital receiver circuitry 28 combines the filtered and de-modulated quadrature signals to extract and provide the received digital data RXDIGITAL. The frequency synthesizer 30 provides the A-to-D clock ADCCLOCK to both A-to-D converters 34, 36 to clock sampling of the quadrature down converted signals $DCS_I$, $DCS_Q$.

Figure 4:
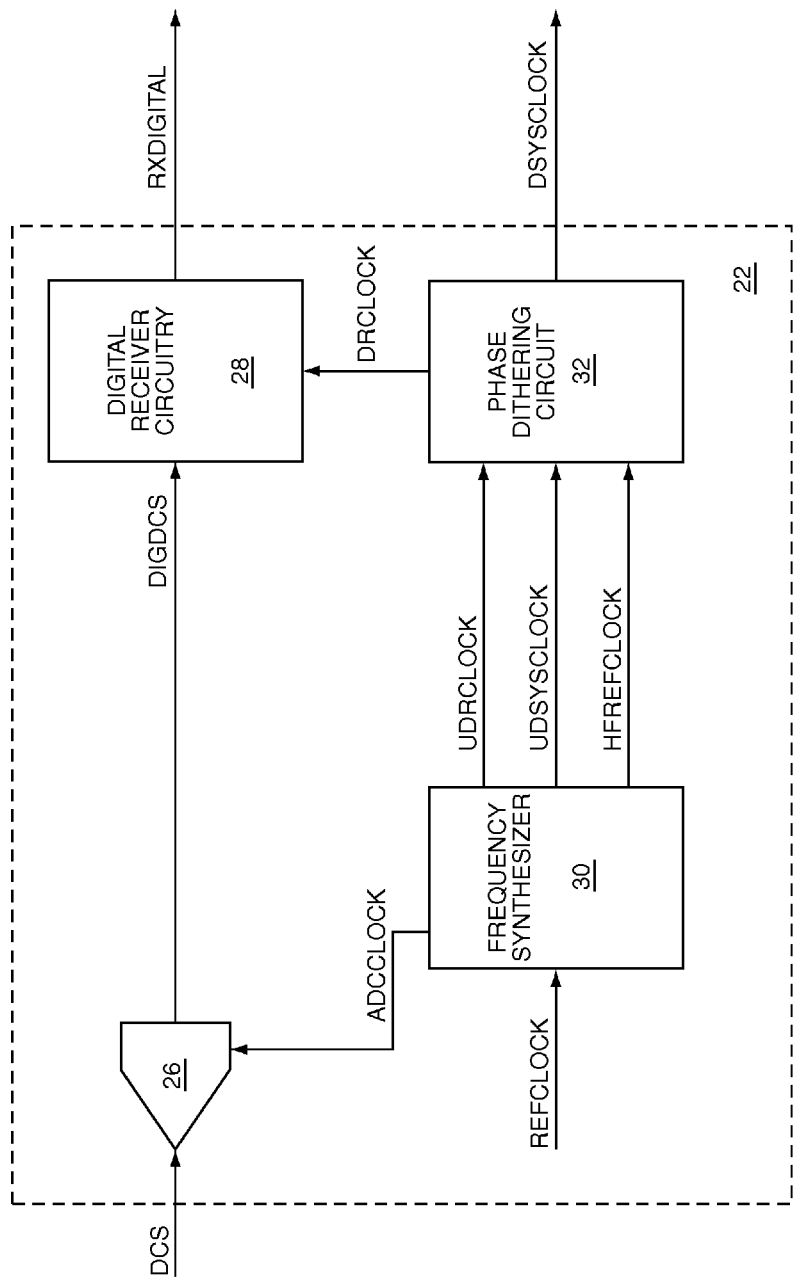
FIG. 4 shows an alternate embodiment of the digital receiver of FIG. 2 wherein the digital receiver clock is phase dithered.

FIG. 4 shows an alternate embodiment of the digital receiver 22 of FIG. 2 wherein the digital receiver clock is phase dithered. Instead of the frequency synthesizer 30 providing the non-dithered receiver clock UDRCLOCK directly to the digital receiver circuitry 28, the frequency synthesizer 30 provides the non-dithered receiver clock UDRCLOCK to the phase dithering circuit 32, which adds phase dithering and provides a phase dithered receiver clock DRCLOCK to the digital receiver circuitry 28. By using a phase dithered receiver clock DRCLOCK, interfering noise signals from the digital receiver circuitry 28 are spread over a range of frequencies, to minimize receiver de-sensitization.

Figure 5:
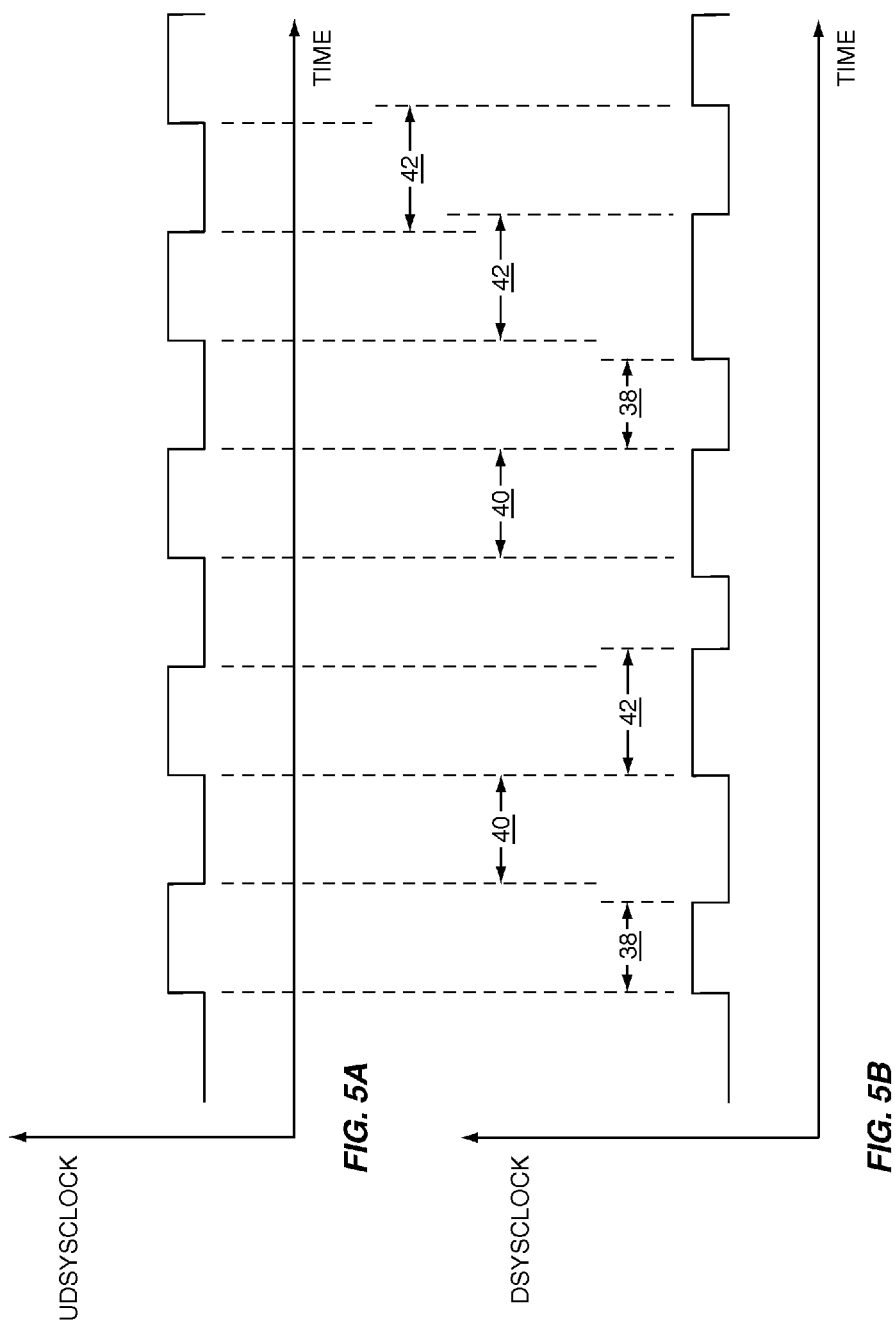
FIG. 5A is a graph showing the non-dithered system clock of FIG. 4.
FIG. 5B is a graph showing the dithered system clock of FIG. 4 wherein each half-cycle is phase dithered.

Each half-cycle of a system clock may be phase dithered, or each whole cycle of a system clock may be phase dithered. Phase dithering may be achieved by changing the duty-cycle of each clock half-cycle. The duty-cycle of a dithered clock half-cycle is defined as the ratio of the period of the dithered clock half-cycle to the corresponding period of a non-dithered clock half-cycle. FIG. 5A is a graph showing the non-dithered system clock UDSYSCLOCK of FIG. 4. FIG. 5B is a graph showing the dithered system clock DSYSCLOCK of FIG. 4 wherein each half-cycle is phase dithered. The period of a dithered half-cycle is measured from the leading clock edge of the non-dithered half-cycle, as shown in FIG. 5A to the trailing edge of the dithered half-cycle, as shown in FIG. 5B. In this embodiment, three different duty-cycles are used, including a short duty-cycle, which corresponds to a short period 38, a nominal duty-cycle, which corresponds to a nominal period 40, and a long duty-cycle, which corresponds to a long period 42. Any number of different duty-cycles may be used. The energy spreading of a system clock is dependent on the number of different duty-cycles, the value of each duty cycle, and the distribution of the different duty-cycles. A frequency spreading algorithm may be used to determine the distribution of the different duty-cycles to achieve desired receiver sensitivities at different receive frequencies. In one frequency spreading algorithm, no more than 1000 consecutive half-cycles ever repeat the same duty-cycle.

Figure 6:
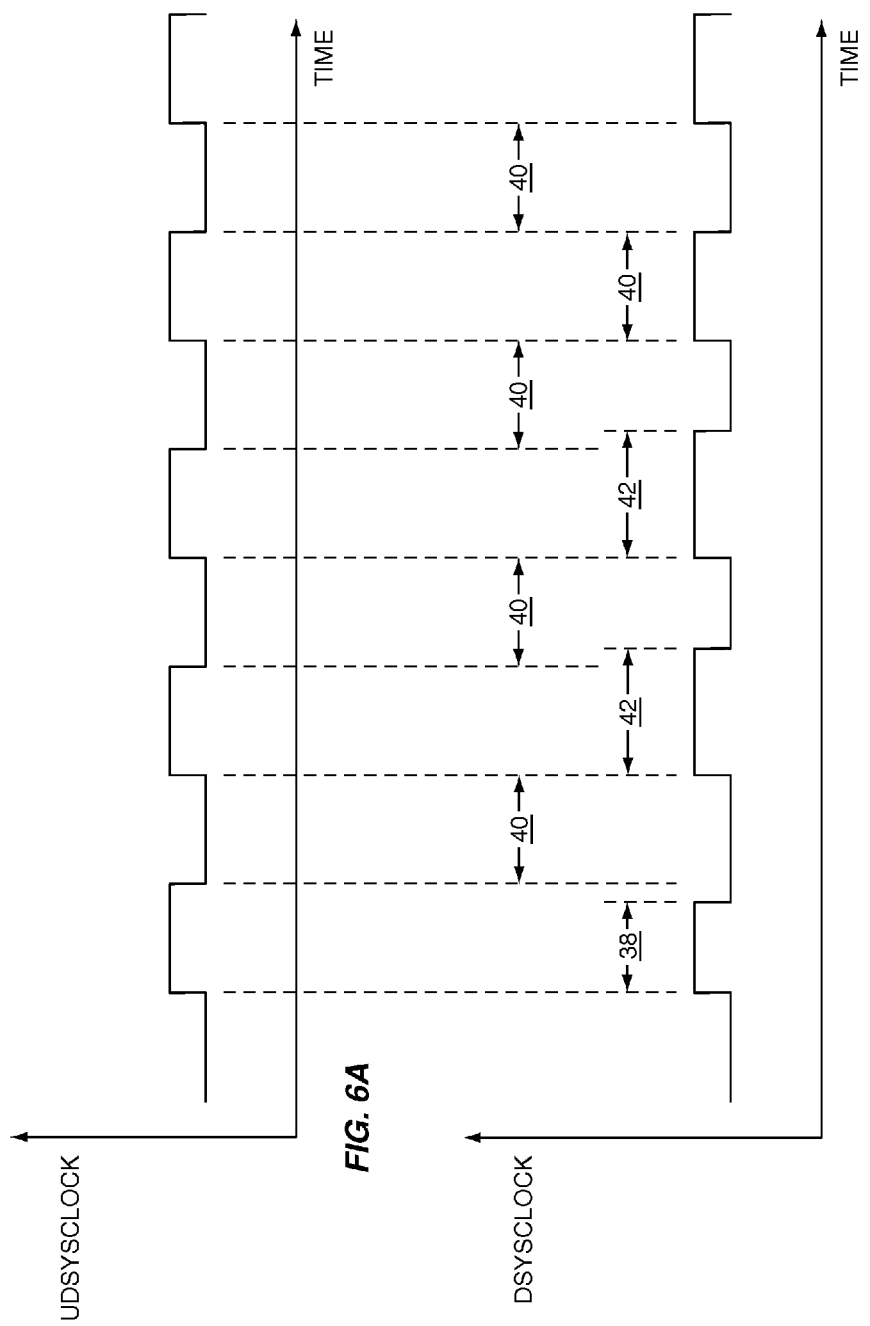
FIG. 6A is a graph showing the non-dithered system clock of FIG. 4.
FIG. 6B is a graph showing an alternate dithered system clock of FIG. 4 wherein each full cycle is phase dithered.

FIG. 6A is a graph showing the non-dithered system clock of FIG. 4. FIG. 6B is a graph showing an alternate dithered system clock of FIG. 4 wherein each full cycle is phase dithered instead of each half-cycle.

In an EGPRS system or a WBCDMA system, system clock frequencies may include 26 Mhz, 19.2 Mhz, 38.4 Mhz, or any combination thereof. In an EGPRS system, the 34th harmonic of a 26 Mhz system clock may fall within a receive frequency band called GSM850. The 36th harmonic of a 26 Mhz system clock may fall within a receive frequency band called EGSM900. The 70th and 71st harmonics of a 26 Mhz system clock may fall within a receive frequency band called Region 3 EGPRS. In a WBCDMA system, the 34th harmonic of a 26 Mhz system clock may fall within a receive frequency band called Freedom of Mobile Multimedia Access (FOMA). The 36th harmonic of a 26 Mhz system clock may fall within a receive frequency band called W900. The 70th and 71st harmonics of a 26 Mhz system clock may fall within a receive frequency band called Region 3 WBCDMA.

Figure 7:
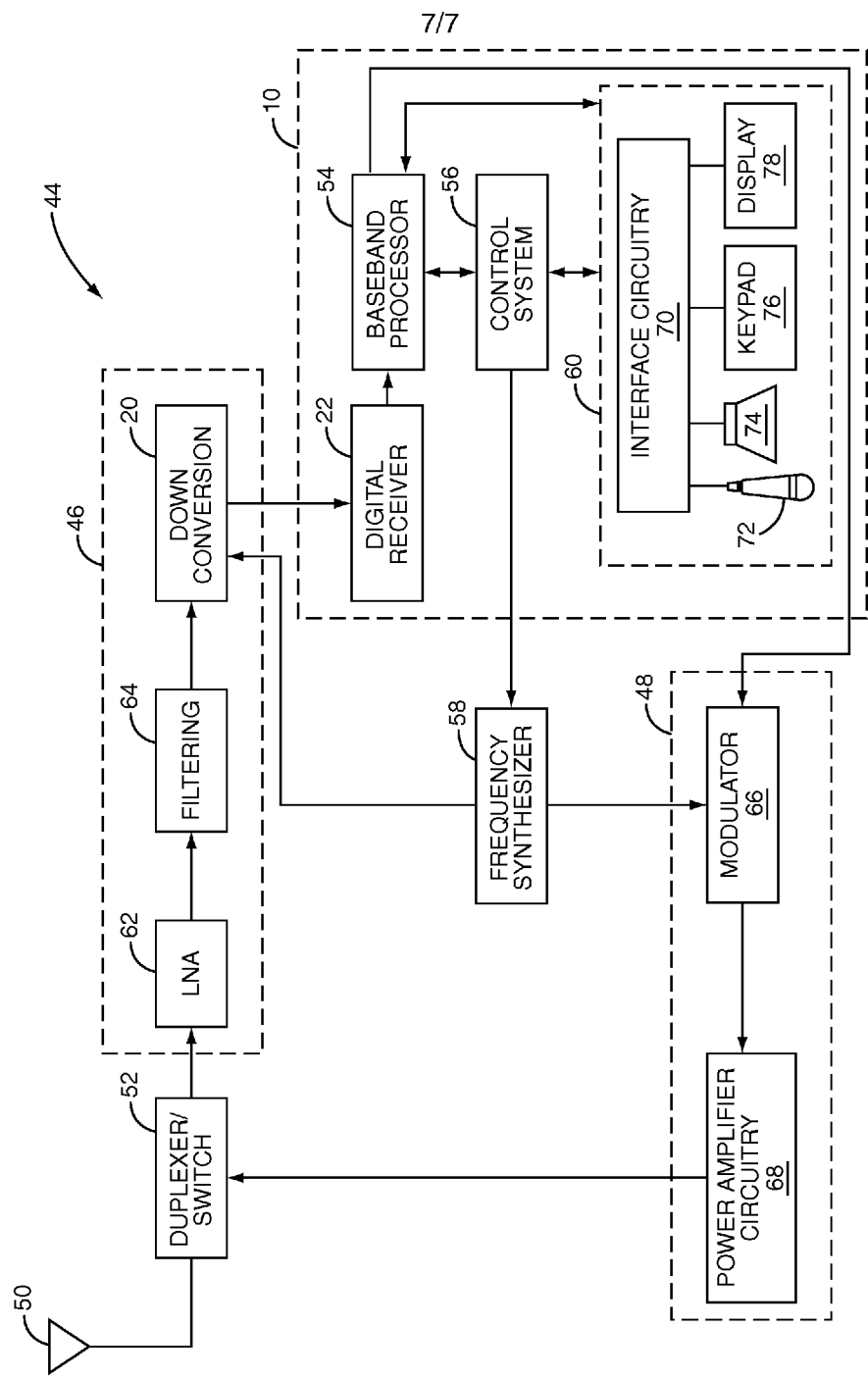
FIG. 7 shows an application example of the present invention used in a mobile terminal.

An application example of a phase dithered digital communications system 10 is its use in a mobile terminal 44. The basic architecture of the mobile terminal 44 is represented in FIG. 7 and may include a receiver front end 46, a radio frequency transmitter section 48, an antenna 50, a duplexer or switch 52, a baseband processor 54, a control system 56, a frequency synthesizer 58, and an interface 60. A digital receiver 22 may provide phase dithered system clocks to the baseband processor 54, the control system 56, the frequency synthesizer 58, and the interface 60. The receiver front end 46 receives information bearing radio frequency signals from one or more remote transmitters provided by a base station. A low noise amplifier (LNA) 62 amplifies the signal. A filter circuit 64 minimizes broadband interference in the received signal, while down conversion circuitry 20 down converts the filtered, received signal into an intermediate or baseband frequency signal, which is provided to the digital receiver 22. The digital receiver 22 digitizes the down converted signal into a digital signal, which is provided to the baseband processor 54. The receiver front end 46 typically uses one or more mixing frequencies generated by the frequency synthesizer 58. The baseband processor 54 processes the digitized received signal to extract the information or data bits conveyed in the received signal. This processing typically comprises demodulation, decoding, and error correction operations. As such, the baseband processor 54 is generally implemented in one or more digital signal processors (DSPs).

On the transmit side, the baseband processor 54 receives digitized data, which may represent voice, data, or control information, from the control system 56, which it encodes for transmission. The encoded data is output to the transmitter 48, where it is used by a modulator 66 to modulate a carrier signal that is at a desired transmit frequency. Power amplifier circuitry 68 amplifies the modulated carrier signal to a level appropriate for transmission, and delivers the amplified and modulated carrier signal to the antenna 50 through the duplexer or switch 52.

A user may interact with the mobile terminal 44 via the interface 60, which may include interface circuitry 70 associated with a microphone 72, a speaker 74, a keypad 76, and a display 78. The interface circuitry 70 typically includes analog-to-digital converters, digital-to-analog converters, amplifiers, and the like. Additionally, it may include a voice encoder/decoder, in which case it may communicate directly with the baseband processor 54. The microphone 72 will typically convert audio input, such as the user's voice, into an electrical signal, which is then digitized and passed directly or indirectly to the baseband processor 54. Audio information encoded in the received signal is recovered by the baseband processor 54, and converted by the interface circuitry 70 into an analog signal suitable for driving the speaker 74. The keypad 76 and display 78 enable the user to interact with the mobile terminal 44, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A communications system comprising:
an analog-to-digital converter adapted to:
receive an analog down converted receiver signal;
provide a digital down converted receiver signal based on the analog down converted receiver signal; and
receive a first clock signal comprising a first clock frequency and a plurality of first clock half-cycles, wherein each first clock half-cycle has a duty-cycle that remains essentially constant;
digital circuitry adapted to receive a phase-dithered second clock signal comprising a second clock frequency and a plurality of second clock half-cycles, wherein each second clock half-cycle has a duty-cycle that is one of a plurality of duty-cycles, and wherein the second clock frequency has a period that is substantially constant; and
clock generator circuitry adapted to provide the first clock signal and the phase-dithered second clock signal.

2. The communications system of claim 1 wherein the phase-dithered second clock signal is used to provide a first system clock for the digital circuitry.

3. The communications system of claim 2 wherein the digital circuitry further comprises a plurality of digital circuits adapted to receive the first system clock such that at least one of the plurality of digital circuits changes state based on the first system clock.

4. The communications system of claim 1 wherein the digital circuitry is further adapted to receive a plurality of clock signals comprising a plurality of clock frequencies, wherein each of the plurality of clock signals comprises a plurality of clock half-cycles, and each clock half-cycle has a duty-cycle that is one of a second group consisting of a plurality of duty-cycles.

5. The communications system of claim 4 wherein the plurality of clock signals is used to provide a plurality of system clocks for the digital circuitry.

6. The communications system of claim 1 wherein the plurality of duty-cycles consists of a short duty-cycle, a nominal duty cycle, and a long duty-cycle.

7. The communications system of claim 1 wherein a ratio of the first clock frequency divided by the second clock frequency is essentially equal to a first integer divided by a second integer.

8. The communications system of claim 1 wherein the digital circuitry is further adapted to receive the digital down converted receiver signal.

9. The communications system of claim 1 wherein the analog down converted receiver signal further comprises an in-phase analog down converted receiver signal and a quadrature-phase analog down converted receiver signal, wherein the in-phase analog down converted receiver signal is phase-shifted from the quadrature-phase analog down converted receiver signal by essentially 90 degrees.

10. The communications system of claim 1 wherein the first clock signal and the second clock signal are based on a reference clock signal.

11. The communications system of claim 1 wherein the duty-cycle of each second clock half-cycle is based on a frequency spreading algorithm.

12. The communications system of claim 1 wherein a pattern for phase-dithering the phase-dithered second clock signal is based on a receive center frequency.

13. The communications system of claim 1 wherein every other second clock half-cycle has a duty-cycle that is a nominal duty-cycle.

14. The communications system of claim 1 wherein the second clock signal further comprises a plurality of second clock cycles, wherein each second clock cycle has a duty-cycle that is one of a plurality of duty-cycles.

15. The communications system of claim 1 wherein the first clock signal is not phase-dithered.

16. The communications system of claim 1 further comprising down conversion circuitry adapted to receive an RF input signal and provide the analog down converted receiver signal.

17. The communications system of claim 1 wherein the analog down converted receiver signal comprises a continuous receiver signal.

18. The communications system of claim 1 wherein the analog down converted receiver signal comprises a wideband code division multiple access (WBCDMA) receiver signal.

19. The communications system of claim 1 wherein the analog down converted receiver signal comprises an enhanced general packet radio service (EGPRS) receiver signal.

20. The communications system of claim 1 further comprising digital receiver circuitry adapted to receive the digital down converted receiver signal, and adapted to receive a third clock signal comprising a third clock frequency and a plurality of third clock half-cycles, wherein each third clock half-cycle has a duty-cycle that remains essentially constant.

21. A method comprising:
   receiving an analog down converted receiver signal;
   providing a digital down converted receiver signal based on the analog down converted receiver signal;
   receiving a first clock signal comprising a first clock frequency and a plurality of first clock half-cycles, wherein each first clock half-cycle has a duty-cycle that remains essentially constant;
   receiving a phase-dithered second clock signal comprising a second clock frequency and a plurality of second clock half-cycles, wherein each second clock half-cycle has a duty-cycle that is one of a group consisting of a short duty-cycle, a nominal duty cycle, and a long duty-cycle, wherein the period of the second clock frequency is substantially constant;
   providing the first clock signal to an analog-to-digital converter that is adapted to provide the digital down converted receiver signal; and
   providing the phase-dithered second clock signal to digital circuitry.

22. A communication system comprising:
   a frequency synthesizer configured to generate an undithered system clock and a high frequency reference clock; and
   a phase dithering circuit configured to receive the undithered system clock and the high frequency reference clock, wherein the phase dithering circuit is further configured to generate a phase dithered system clock based upon the undithered system clock and the high frequency reference clock, and wherein the phase dithered system clock has a period that is substantially constant.

23. The communication system of claim 22 further comprising:
   digital receiver circuitry configured to receive an undithered receiver clock; and
   digital system circuitry configured to receive the phase dithered system clock.

24. The communication system of claim 22 wherein the phase dithered system clock includes a substantially constant period and the duty-cycle of the phase dithered system clock is phase modulated.

25. The communication system of claim 22 wherein the undithered system clock and the high frequency reference clock are related by a ratio.

26. A method for generating a phase dithered clock comprising:
   receiving an undithered system clock;
   receiving a high frequency reference clock;
   generating a phase dithered system clock based upon the undithered system clock and the high frequency reference clock, and wherein a period of the phase dithered system clock is the same as a period of the undithered system clock;
   providing the undithered system clock to a digital receiver circuit; and
   providing the phase dithered system clock to a digital system circuitry.

* * * * *